United States Patent
Lee et al.

(10) Patent No.: US 11,916,523 B2
(45) Date of Patent: Feb. 27, 2024

(54) AMPLIFICATION APPARATUS, INTEGRATION APPARATUS AND MODULATION APPARATUS EACH INCLUDING DUTY-CYCLED RESISTOR

(71) Applicants: Samsung Electronics Co., Ltd., Suwon-si (KR); Korea Advanced Institute of Science and Technology, Daejeon (KR)

(72) Inventors: Wonseok Lee, Suwon-si (KR); Kent Edrian Lozada, Daejeon (KR); Seung Tak Ryu, Daejeon (KR); Sang Joon Kim, Hwaseong-si (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 354 days.

(21) Appl. No.: 17/228,982

(22) Filed: Apr. 13, 2021

(65) Prior Publication Data
US 2022/0123700 A1     Apr. 21, 2022

(30) Foreign Application Priority Data
Oct. 16, 2020    (KR) ........................ 10-2020-0134601

(51) Int. Cl.
*H03F 3/45*       (2006.01)
(52) U.S. Cl.
CPC ... *H03F 3/45475* (2013.01); *H03F 2200/129* (2013.01); *H03F 2203/45512* (2013.01)

(58) Field of Classification Search
CPC .......... H03F 3/45475; H03F 2200/129; H03F 2203/45512; H03F 1/34; H03F 2200/331;
(Continued)

(56) References Cited

U.S. PATENT DOCUMENTS 9,411,987 B2 * 8/2016 Alladi ................. G06G 7/1865
10,431,424 B2 10/2019 Mavretic et al.
(Continued)

OTHER PUBLICATIONS

Wattanapanitch, et al. "An energy-efficient micropower neural recording amplifier." *IEEE Transactions on Biomedical Circuits and Systems* 1.2 (Jun. 2007) (12 pages in English).
(Continued)

*Primary Examiner* — Andrea Lindgren Baltzell
*Assistant Examiner* — Khiem D Nguyen
(74) *Attorney, Agent, or Firm* — NSIP Law

(57) ABSTRACT

An amplification apparatus includes an amplifier having an inverting terminal, and a non-inverting terminal connected to a reset voltage node, a first capacitor connected to the inverting terminal, an input voltage being applied to the first capacitor, a second capacitor connected to the inverting terminal and an output terminal of the amplifier, and a duty-cycled resistor, connected in parallel to the second capacitor, including a first resistor. The duty-cycled resistor is configured to connect the first resistor and the inverting terminal and to disconnect the first resistor and the reset voltage node during a first time interval included in a period to complete an on-and-off cycle of the duty-cycled resistor, and disconnect the first resistor and the inverting terminal and to connect the first resistor and the reset voltage node during a second time interval included in the period.

15 Claims, 3 Drawing Sheets

(58) Field of Classification Search
CPC . H03F 2203/45116; H03F 2203/45118; H03F 2203/45136; H03F 2200/156; H03F 2203/45174; H03F 2203/45526; H03F 2203/45534; H03F 2203/45536; H03F 2203/45616; H03F 2203/45618; H03F 3/005; H03M 3/342; H03M 3/458; G06G 7/186; H03C 1/12
USPC .................................................. 330/252–261
See application file for complete search history.

(56) References Cited

U.S. PATENT DOCUMENTS

| | | |
|---|---|---|
| 10,680,636 B2 | 6/2020 | Kim et al. |
| 2017/0230019 A1 | 8/2017 | Chandrakumar et al. |
| 2019/0279079 A1 | 9/2019 | Sim et al. |
| 2020/0099352 A1 | 3/2020 | Chandrakumar et al. |
| 2020/0274546 A1 | 8/2020 | Kim et al. |

OTHER PUBLICATIONS

Chandrakumar, et al. "A high dynamic-range neural recording chopper amplifier for simultaneous neural recording and stimulation." *IEEE Journal of Solid-State Circuits* 52.3 (Mar. 2017) (12 pages in English).

* cited by examiner

AMPLIFICATION APPARATUS, INTEGRATION APPARATUS AND MODULATION APPARATUS EACH INCLUDING DUTY-CYCLED RESISTOR

CROSS-REFERENCE TO RELATED APPLICATIONS

This application claims the benefit under 35 USC § 119(a) of Korean Patent Application No. 10-2020-0134601, filed on Oct. 16, 2020, in the Korean Intellectual Property Office, the entire disclosure of which is incorporated herein by reference for all purposes.

BACKGROUND

1. Field

The following description relates to a duty-cycled resistor, and more particularly, to a duty-cycled resistor for mitigating an effect of a parasitic capacitor.

2. Description of Related Art

A duty-cycled resistor may be a resistor with a switch that is periodically turned on or off. The switch may be repeatedly opened and closed (i.e., shorted) at a predetermined frequency. A proportion of time in which a switch is closed with respect to one period is defined as a duty cycle D. For example, a duty cycle D of a switch that is closed for 1 second and that is opened for 99 seconds may be 1/100.

The above description has been possessed or acquired by the inventor(s) in the course of conceiving the present disclosure and is not necessarily an art publicly known before the present application is filed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an amplification apparatus includes an amplifier having an inverting terminal, and a non-inverting terminal connected to a reset voltage node, a first capacitor connected to the inverting terminal, an input voltage being applied to the first capacitor, a second capacitor connected to the inverting terminal and an output terminal of the amplifier, and a duty-cycled resistor, connected in parallel to the second capacitor, including a first resistor. The duty-cycled resistor is configured to connect the first resistor and the inverting terminal and to disconnect the first resistor and the reset voltage node during a first time interval included in a period to complete an on-and-off cycle of the duty-cycled resistor, and disconnect the first resistor and the inverting terminal and to connect the first resistor and the reset voltage node during a second time interval included in the period.

The duty-cycled resistor may include a first switch and a second switch. The first switch may be configured to connect the first resistor and the inverting terminal during the first time interval and to disconnect the first resistor and the inverting terminal during the second time interval, and the second switch may be configured to disconnect the first resistor and the reset voltage node during the first time interval and to connect the first resistor and the reset voltage node during the second time interval.

The duty-cycled resistor may include a third switch. The third switch may be configured to connect the first resistor and the inverting terminal during the first time interval, disconnect the first resistor and the inverting terminal during the second time interval, disconnect the first resistor and the reset voltage node during the first time interval, and connect the first resistor and the reset voltage node during the second time interval.

The first resistor may include a second resistor and a third resistor. The duty-cycled resistor may include a fourth switch, a fifth switch, and a sixth switch. The fourth switch may be configured to connect the second resistor and the inverting terminal during the first time interval and to disconnect the second resistor and the inverting terminal during the second time interval. The fifth switch may be configured to disconnect the second resistor and the reset voltage node during the first time interval and to connect the second resistor and the reset voltage node during the second time interval. The sixth switch may be configured to disconnect the third resistor and the reset voltage node during the first time interval and to connect the third resistor and the reset voltage node during the second time interval.

The first resistor may include a second resistor and a third resistor. The duty-cycled resistor may include a seventh switch and an eighth switch. The seventh switch may be configured to connect the second resistor and the inverting terminal during the first time interval, disconnect the second resistor and the inverting terminal during the second time interval, disconnect the second resistor and the reset voltage node during the first time interval, and connect the second resistor and the reset voltage node during the second time interval. The eighth switch may be configured to disconnect the third resistor and the reset voltage node during the first time interval, and connect the third resistor and the reset voltage node during the second time interval.

In another general aspect, an integration apparatus includes an amplifier having an inverting terminal, and a non-inverting terminal connected to a reset voltage node, a duty-cycled resistor connected to the inverting terminal, an input voltage being applied to the duty-cycled resistor, and a first capacitor connected to the inverting terminal and an output terminal of the amplifier. The duty-cycled resistor includes a first resistor. The duty-cycled resistor is configured to connect the first resistor and the inverting terminal and to disconnect the first resistor and the reset voltage node during a first time interval included in a period to complete an on-and-off cycle of the duty-cycled resistor, and disconnect the first resistor and the inverting terminal and to connect the first resistor and the reset voltage node during a second time interval included in the period.

The duty-cycled resistor may include a first switch and a second switch. The first switch may be configured to connect the first resistor and the inverting terminal during the first time interval and to disconnect the first resistor and the inverting terminal during the second time interval, and the second switch may be configured to disconnect the first resistor and the reset voltage node during the first time interval and to connect the first resistor and the reset voltage node during the second time interval.

The duty-cycled resistor may include a third switch. The third switch may be configured to connect the first resistor and the inverting terminal during the first time interval, disconnect the first resistor and the inverting terminal during the second time interval, disconnect the first resistor and the reset voltage node during the first time interval, and connect the first resistor and the reset voltage node during the second time interval.

The first resistor may include a second resistor and a third resistor. The duty-cycled resistor may include a fourth switch, a fifth switch, and a sixth switch. The fourth switch may be configured to connect the second resistor and the inverting terminal during the first time interval and to disconnect the second resistor and the inverting terminal during the second time interval. The fifth switch may be configured to disconnect the second resistor and the reset voltage node during the first time interval and to connect the second resistor and the reset voltage node during the second time interval. The sixth switch may be configured to disconnect the third resistor and the reset voltage node during the first time interval and to connect the third resistor and the reset voltage node during the second time interval.

The first resistor may include a second resistor and a third resistor. The duty-cycled resistor may include a seventh switch and an eighth switch. The seventh switch may be configured to connect the second resistor and the inverting terminal during the first time interval, disconnect the second resistor and the inverting terminal during the second time interval, disconnect the second resistor and the reset voltage node during the first time interval, and connect the second resistor and the reset voltage node during the second time interval. The eighth switch may be configured to disconnect the third resistor and the reset voltage node during the first time interval, and connect the third resistor and the reset voltage node during the second time interval.

In another general aspect, a modulation apparatus includes a subtraction circuit to which an input voltage is applied, an amplification circuit, an integration circuit, and a quantization circuit. The amplification circuit, connected to the subtraction circuit, includes an amplifier having an inverting terminal and a non-inverting terminal, the non-inverting terminal connected to a reset voltage node, a first capacitor connected to the inverting terminal, the input voltage being applied to the first capacitor, a second capacitor connected to the inverting terminal and an output terminal of the amplifier, and a duty-cycled resistor, connected in parallel to the second capacitor, including a first resistor. The integration circuit is connected to the amplification circuit. The quantization circuit is connected to the integration circuit and configured to output an output signal through an output terminal. The duty-cycled resistor is configured to connect the first resistor and the inverting terminal and to disconnect the first resistor and the reset voltage node during a first time interval included in a period to complete an on-and-off cycle of the duty-cycled resistor, and to disconnect the first resistor and the inverting terminal and to connect the first resistor and the reset voltage node during a second time interval included in the period. The subtraction circuit comprises the first capacitor, and a feedback capacitive digital-to-analog converter (FB CDAC) configured to connect the output terminal to the inverting terminal.

The duty-cycled resistor may include a first switch and a second switch. The first switch may be configured to connect the first resistor and the inverting terminal during the first time interval and to disconnect the first resistor and the inverting terminal during the second time interval, and the second switch may be configured to disconnect the first resistor and the reset voltage node during the first time interval and to connect the first resistor and the reset voltage node during the second time interval.

The duty-cycled resistor may include a third switch. The third switch may be configured to connect the first resistor and the inverting terminal during the first time interval, disconnect the first resistor and the inverting terminal during the second time interval, disconnect the first resistor and the reset voltage node during the first time interval, and connect the first resistor and the reset voltage node during the second time interval.

The first resistor may include a second resistor and a third resistor. The duty-cycled resistor may include a fourth switch, a fifth switch, and a sixth switch. The fourth switch may be configured to connect the second resistor and the inverting terminal during the first time interval and to disconnect the second resistor and the inverting terminal during the second time interval. The fifth switch may be configured to disconnect the second resistor and the reset voltage node during the first time interval and to connect the second resistor and the reset voltage node during the second time interval. The sixth switch may be configured to disconnect the third resistor and the reset voltage node during the first time interval and to connect the third resistor and the reset voltage node during the second time interval.

The first resistor may include a second resistor and a third resistor. The duty-cycled resistor may include a seventh switch and an eighth switch. The seventh switch may be configured to connect the second resistor and the inverting terminal during the first time interval, disconnect the second resistor and the inverting terminal during the second time interval, disconnect the second resistor and the reset voltage node during the first time interval, and connect the second resistor and the reset voltage node during the second time interval. The eighth switch may be configured to disconnect the third resistor and the reset voltage node during the first time interval, and connect the third resistor and the reset voltage node during the second time interval.

Other features and aspects will be apparent from the following detailed description, the drawings, and the claims.

Figure 1:
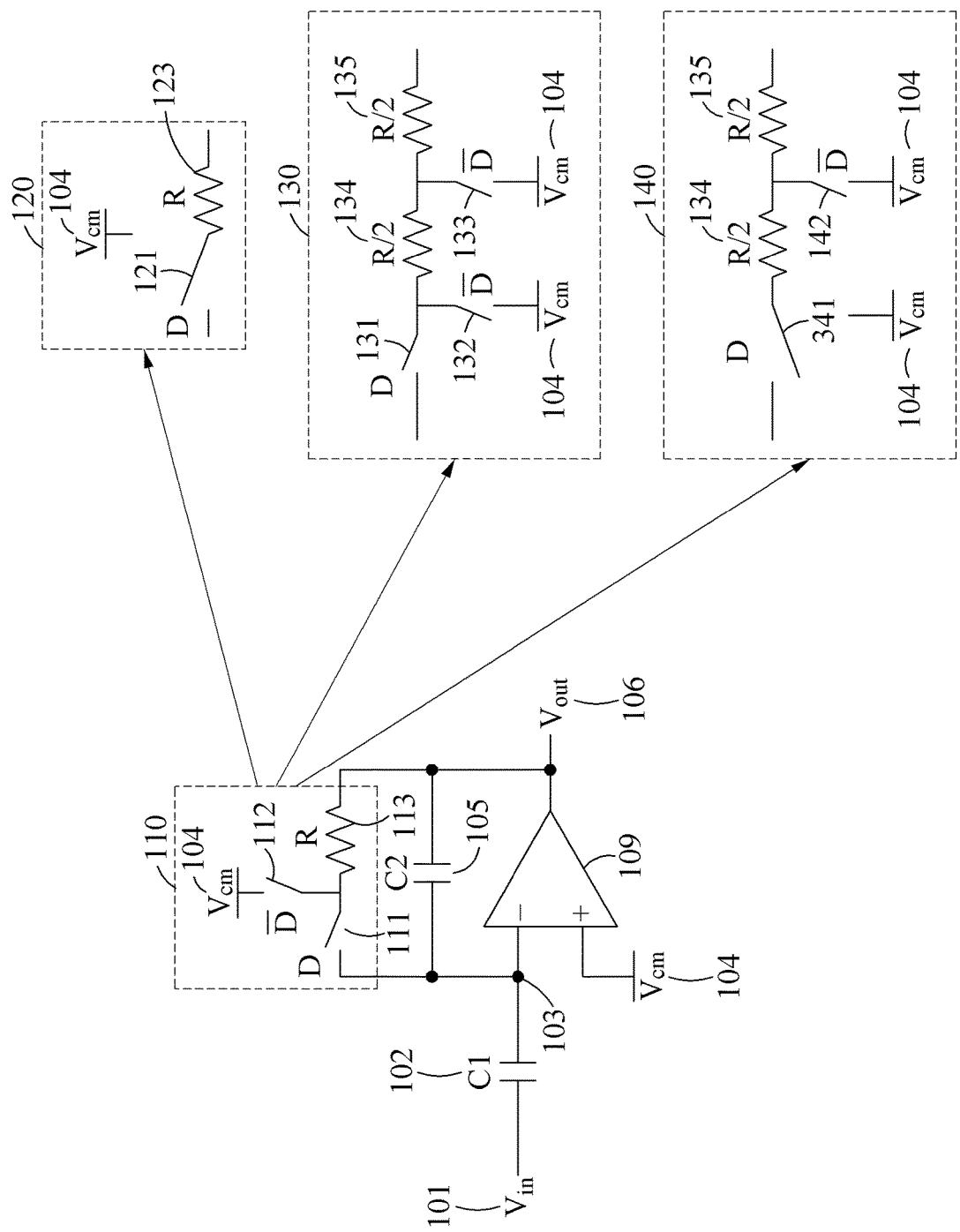
FIG. 1 illustrates an example of a structure of an amplification apparatus with a duty-cycled resistor.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. As used herein, the term "and/or" includes any one and any combination of any two or more of the associated listed items. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood. Terms defined in dictionaries generally used should be construed to have meanings matching with contextual meanings in the related art and are not to be construed as an ideal or excessively formal meaning unless otherwise defined herein.

Hereinafter, examples will be described in detail with reference to the accompanying drawings, and like reference numerals in the drawings refer to like elements throughout.

FIG. 1 illustrates an example of a structure of an amplification apparatus with a duty-cycled resistor.

In an example, a duty-cycled resistor, which will be referred to as a DCR, is provided. The duty-cycled resistor may have a reset function. The duty-cycled resistor may reset potentials with a reset voltage in a state of being open with a main circuit. The duty-cycled resistor may mitigate an effect caused by a parasitic capacitor through the reset function. The duty-cycled resistor may alleviate a performance degradation phenomenon caused by parasitic capacitance. The use of the term 'may' herein with respect to an example or embodiment, e.g., as to what an example or embodiment may include, implement, or achieve means that at least one example or embodiment exists with such a feature, implementation, or achievement, while also noting that all examples and embodiments are not limited thereto and alternate examples or embodiments may also exist.

The duty-cycled resistor may be applied to an amplification apparatus, an integration apparatus, and a modulation apparatus that each include a capacitor. The duty-cycled resistor may be applied to a biosignal measurement circuit with a capacitive amplifier. The duty-cycled resistor may be applied to a low-power amplifier of a low-frequency band for an easier direct current (DC) bias design. The duty-cycled resistor may be used to implement a relatively high resistance value for a DC bias of a low-frequency amplifier with capacitive feedback.

The duty-cycled resistor may include a resistor R and a switch with a duty cycle D. An equivalent resistance of the duty-cycled resistor may be expressed as R/D. For example, if the duty cycle D of the switch is 1/100, the equivalent resistance may be 100R. Thus, a higher equivalent resistance may be obtained by adjusting the duty cycle.

The duty-cycled resistor may have a memory effect. The memory effect may be a phenomenon in which a parasitic voltage is stored in a parasitic capacitor during a period of time in which the duty-cycled resistor is not connected to the main circuit, which causes noise in a next period.

For example, a circuit configured by connecting a duty-cycled resistor and an inverting terminal of an amplifier, for example, an operational amplifier (OPA), may be assumed. In this example, the inverting terminal may be referred to as a summing node. There is no problem if the duty-cycled resistor is ideal; however, the duty-cycled resistor has a parasitic capacitor. When a switch is shorted, a current may be applied to the inverting terminal through a resistor. When the switch is opened, a current flowing to the inverting terminal through the resistor may be blocked. However, even if the switch is opened, electric charges may be stored in the parasitic capacitor, and a voltage stored in the parasitic capacitor may be applied to the inverting terminal when the switch is shorted in the next period. In other words, an unwanted output at an output terminal may be caused by unwanted parasitic voltages.

A duty-cycled resistor used in an amplifier may include a parasitic capacitor Cp. Here, Rf may represent a feedback resistor and may be disposed on a feedback path of the amplifier. In an ideal case, the parasitic capacitor Cp may be "0", and only a present output signal may be input to an inverting terminal of the amplifier through the feedback path when a switch is changed from an open state to a short state. However, if the parasitic capacitor Cp is not "0", an output voltage of the amplifier when the switch is in an open state may be stored in the form of electric charges in the parasitic capacitor Cp. When the switch is shorted, the electric charges stored in the parasitic capacitor Cp may be transferred to the inverting terminal of the amplifier, and the amplifier may output an incorrect output signal by an unwanted initial voltage. Accordingly, a signal-to-noise ratio (SNR) of the amplifier may decrease.

In an example, the duty-cycled resistor may include a reset switch. The reset switch may connect one end of a resistor included in the duty-cycled resistor to a reset voltage node during a period of time in which the duty-cycled resistor is not connected to a main circuit. To remove output signal information stored in the parasitic capacitor Cp when the switch is opened, the duty-cycled resistor may connect the resistor to the reset voltage node.

When the switch of the duty-cycled resistor is in the open state, the duty-cycled resistor may connect the resistor to the reset voltage node instead of allowing the resistor to be in a floating state. The parasitic capacitor Cp may have the same voltage as that of the inverting terminal regardless of an output signal, and a signal stored in the parasitic capacitor Cp may disappear. Thus, a parasitic voltage stored in the parasitic capacitor during a period of time in which the duty-cycled resistor is not connected to the main circuit may be removed.

To this end, the amplification apparatus may include an amplifier 109, a first capacitor 102, a second capacitor 105, and a duty-cycled resistor 110. The amplifier 109 may include an inverting terminal 103 and a non-inverting terminal 104 connected to a reset voltage node Vcm 104. An input voltage Vin 101 may be applied to the first capacitor 102, and the first capacitor 102 may be connected to the inverting terminal 103. The second capacitor 105 may be connected to the inverting terminal 103 and an output terminal 106 of the amplifier 109. The duty-cycled resistor 110 may be connected in parallel to the second capacitor 105.

The duty-cycled resistor 110 may include a first resistor Rf 113. A switch of the duty-cycled resistor 110 may be repeatedly opened and closed (i.e., shorted) in a predetermined period. A single period may include a first time interval and a second time interval. The duty-cycled resistor 110 may connect the first resistor Rf 113 and the inverting terminal 103 and may disconnect the first resistor Rf 113 and the reset voltage node Vcm 104 during the first time interval. The duty-cycled resistor 110 may disconnect the first resistor Rf 113 and the inverting terminal 103 and may connect the first resistor Rf 113 and the reset voltage node Vcm 104 during the second time interval.

In an example, the duty-cycled resistor 110 may include a first switch 111 and a second switch 112. The first switch 111 may connect the first resistor Rf 113 and the inverting terminal 103 during the first time interval, and may open the first resistor Rf 113 and the inverting terminal 103 during the second time interval. The second switch 112 may open the first resistor Rf 113 and the reset voltage node Vcm 104 during the first time interval, and may connect the first resistor Rf 113 and the reset voltage node Vcm 104 during the second time interval. The first resistor Rf 113 and the reset voltage node Vcm 104 may be shorted by the second switch 112 during the second time interval. Accordingly, electric charges stored in the parasitic capacitor may be removed.

In another example, a duty-cycled resistor 120 may be used instead of the duty-cycled resistor 110. The duty-cycled resistor 120 may include a third switch 121 and a first resistor Rf 123. The third switch 121 may connect the first resistor Rf 123 and the inverting terminal 103 during the first time interval and may open the first resistor Rf 123 and the inverting terminal 103 during the second time interval. Also, the third switch 121 may open the first resistor Rf 123 and the reset voltage node Vcm 104 during the first time interval and may connect the first resistor Rf 123 and the reset voltage node Vcm 104 during the second time interval. The first resistor Rf 123 and the reset voltage node Vcm 104 may be shorted by the third switch 121 during the second time interval. Accordingly, electric charges stored in the parasitic capacitor may be removed.

If a resistor is large, resetting may not be performed quickly enough with a single switch. In another example, the resistor may be divided into two or more smaller resistors; thus, resetting may be more quickly performed through a plurality of switches. A duty-cycled resistor 130 may be used instead of the duty-cycled resistor 110. In the duty-cycled resistor 130, the first resistor Rf 113 may include a second resistor 134 and a third resistor 135. The duty-cycled resistor 130 may include a fourth switch 131, a fifth switch 132, and a sixth switch 133. The second resistor 134 and the third resistor 135 may each be R/2, but are not limited thereto.

The fourth switch 131 may connect the second resistor 134 and the inverting terminal 103 during the first time interval and may open the second resistor 134 and the inverting terminal 103 during the second time interval. The fifth switch 132 may open the second resistor 134 and the reset voltage node Vcm 104 during the first time interval and may connect the second resistor 134 and the reset voltage node Vcm 104 during the second time interval. The sixth switch 133 may open the third resistor 135 and the reset voltage node Vcm 104 during the first time interval and may connect the third resistor 135 and the reset voltage node Vcm 104 during the second time interval. During the second time interval, the second resistor 134 and the reset voltage node Vcm 104 may be shorted by the fifth switch 132, and the third resistor 135 and the reset voltage node Vcm 104 may be shorted by the sixth switch 133. Accordingly, electric charges stored in the parasitic capacitor may be removed.

In another example, a duty-cycled resistor 140 may be used instead of the duty-cycled resistor 110. In the duty-cycled resistor 140, the first resistor Rf 113 may include a second resistor 134 and a third resistor 135. The duty-cycled resistor 140 may include a seventh switch 141 and an eighth switch 142. The seventh switch 141 may connect the second resistor 134 and the inverting terminal 103 during the first time interval and may open the second resistor 134 and the inverting terminal 103 during the second time interval. The seventh switch 141 may open the second resistor 134 and the reset voltage node Vcm 104 during the first time interval and may connect the second resistor 134 and the reset voltage node Vcm 104 during the second time interval. The eighth switch 142 may open the third resistor 135 and the reset voltage node Vcm 104 during the first time interval and may connect the third resistor 135 and the reset voltage node Vcm 104 during the second time interval. The second resistor 134 and the third resistor 135 may each be R/2, but are not limited thereto.

However, the duty-cycled resistors 130 and 140 are merely examples, and a resistor may be divided into three or more segments.

Figure 2:
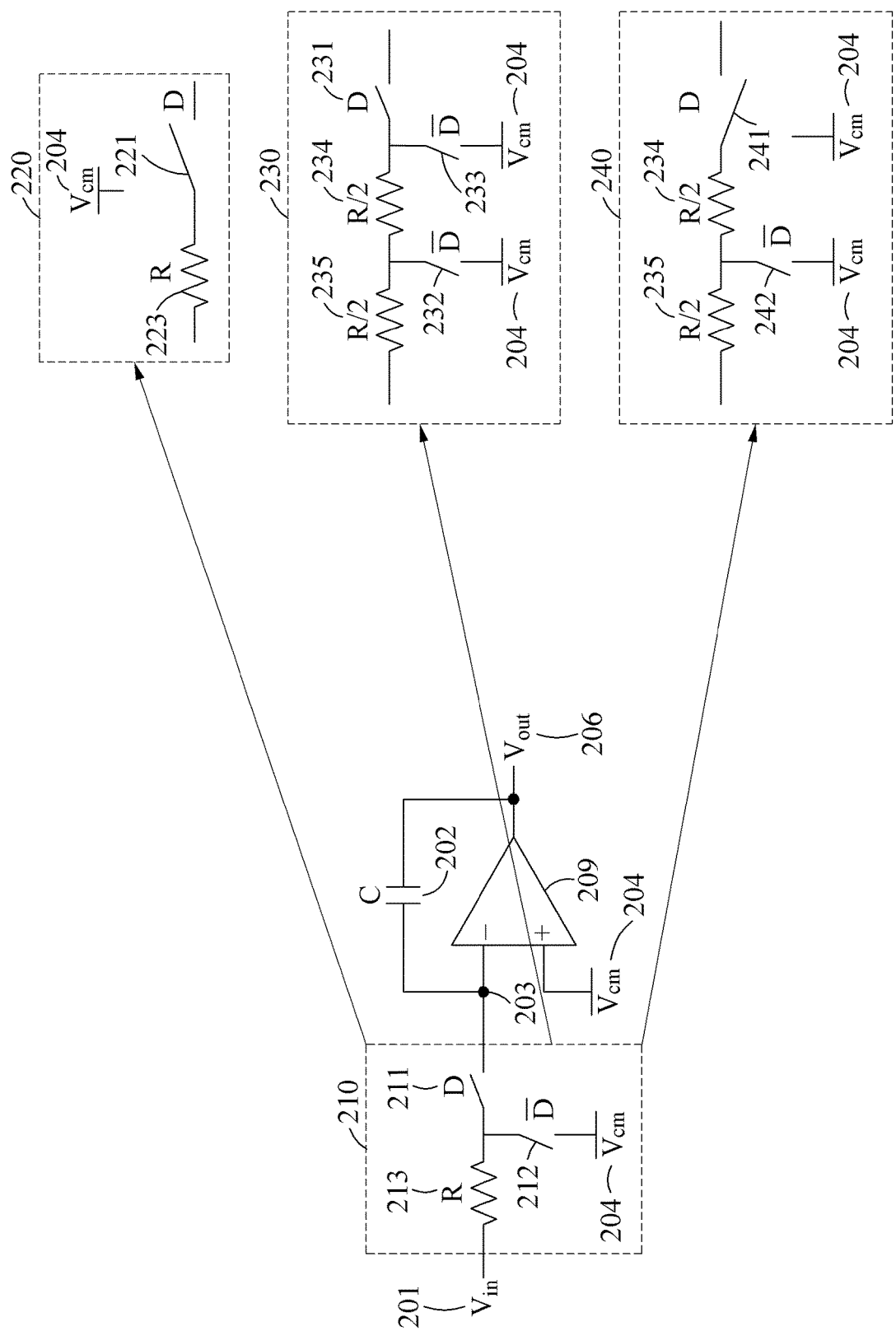
FIG. 2 illustrates an example of a structure of an integration apparatus with a duty-cycled resistor.

FIG. 2 illustrates an example of a structure of an integration apparatus with a duty-cycled resistor.

In an example of a general resistor-capacitor (RC) integrator, a unity gain frequency $\omega_{unity}$ is set to $1/(RC)$. If an extremely low unity gain frequency $\omega_{unity}$ is needed, a duty-cycled resistor may be used as a resistor R. As described above with reference to FIG. 1, when a switch of a duty-cycled resistor is in an open state, a resistor may be connected to the same voltage node as a reset voltage node Vcm of a non-inverting node, instead of being in a floating state. A reset voltage may be applied to a parasitic capacitor Cp at all times, regardless of an output signal, and a memory effect may be removed. Thus, a unity gain frequency of an integrator may be set to $D/(RC)$ through a resistor with a duty cycle D.

To this end, the integration apparatus may include an amplifier 209, a duty-cycled resistor 210, and a first capacitor 202. The amplifier 209 may include an inverting terminal 203 and a non-inverting terminal 203 connected to a reset voltage Vcm. An input voltage Vin 201 may be applied to the duty-cycled resistor 210, and the duty-cycled resistor 210 may be connected to the inverting terminal 203. The first capacitor 202 may be connected to the inverting terminal 203 and an output terminal 206 of the amplifier 209.

The duty-cycled resistor 210 may include a first resistor Rf 213. A switch of the duty-cycled resistor 210 may be repeatedly opened and closed in a predetermined period. A single period may include a first time interval and a second time interval. The duty-cycled resistor 210 may connect the first resistor Rf 213 and the inverting terminal 203 and may open the first resistor Rf 213 and the reset voltage node Vcm 204 during the first time interval. The duty-cycled resistor 210 may open the first resistor Rf 213 and the inverting terminal 203 and may connect the first resistor Rf 213 and the reset voltage node Vcm 204 during the second time interval.

In an example, the duty-cycled resistor 210 may include a first switch 211 and a second switch 212. The first switch 211 may connect the first resistor Rf 213 and the inverting terminal 203 during the first time interval and may open the first resistor Rf 213 and the inverting terminal 203 during the second time interval. The second switch 212 may open the first resistor Rf 213 and the reset voltage node Vcm 204 during the first time interval and may connect the first resistor Rf 213 and the reset voltage node Vcm 204 during the second time interval. The first resistor Rf 213 and the reset voltage node Vcm 204 may be shorted by the second switch 212 during the second time interval. Accordingly, electric charges stored in the parasitic capacitor may be removed.

In another example, a duty-cycled resistor 220 may be used instead of the duty-cycled resistor 210. The duty-cycled resistor 220 may include a third switch 221 and a first resistor Rf 223. The third switch 221 may connect the first resistor Rf 223 and the inverting terminal 203 during the first time interval, and may open the first resistor Rf 223 and the inverting terminal 203 during the second time interval. The third switch 221 may open the first resistor Rf 223 and the reset voltage node Vcm 204 during the first time interval and may connect the first resistor Rf 223 and the reset voltage node Vcm 204 during the second time interval. The first resistor Rf 223 and the reset voltage node Vcm 204 may be shorted by the third switch 221 during the second time interval. Accordingly, electric charges stored in the parasitic capacitor may be removed.

If a resistor is large, resetting may not be performed quickly enough with a single switch. In another example, the resistor may be divided into two or more smaller resistors; thus, resetting may be more quickly performed through a plurality of switches. A duty-cycled resistor 230 may be used instead of the duty-cycled resistor 210. In the duty-cycled resistor 230, the first resistor Rf 213 may include a second resistor 234 and a third resistor 235. The duty-cycled resistor 230 may include a fourth switch 231, a fifth switch 232, and a sixth switch 233. The second resistor 234 and the third resistor 235 may each be R/2, but are not limited thereto.

The fourth switch 231 may connect the second resistor 234 and the inverting terminal 203 during the first time interval and may open the second resistor 234 and the inverting terminal 203 during the second time interval. The fifth switch 232 may open the second resistor 234 and the reset voltage node Vcm 204 during the first time interval and may connect the second resistor 234 and the reset voltage node Vcm 204 during the second time interval. The sixth switch 233 may open the third resistor 235 and the reset voltage node Vcm 204 during the first time interval and may connect the third resistor 235 and the reset voltage node Vcm 204 during the second time interval. During the second time interval, the second resistor 234 and the reset voltage node Vcm 204 may be shorted by the fifth switch 232, and the third resistor 235 and the reset voltage node Vcm 204 may be shorted by the sixth switch 233. Accordingly, electric charges stored in the parasitic capacitor may be removed.

In another example, a duty-cycled resistor 240 may be used instead of the duty-cycled resistor 210. In the duty-cycled resistor 240, the first resistor Rf 213 may include a second resistor 234 and a third resistor 235. The duty-cycled resistor 240 may include a seventh switch 241 and an eighth switch 242. The seventh switch 241 may connect the second resistor 234 and the inverting terminal 203 during the first time interval and may open the second resistor 234 and the inverting terminal 203 during the second time interval. The seventh switch 241 may open the second resistor 234 and the reset voltage node Vcm 204 during the first time interval and may connect the second resistor 234 and the reset voltage node Vcm 204 during the second time interval. The eighth switch 242 may open the third resistor 235 and the reset voltage node Vcm 204 during the first time interval and may connect the third resistor 235 and the reset voltage node Vcm 204 during the second time interval. The second resistor 234 and the third resistor 235 may each be R/2, but are not limited thereto.

However, the duty-cycled resistors 230 and 240 are merely examples, and a resistor may be divided into three or more segments.

Figure 3:
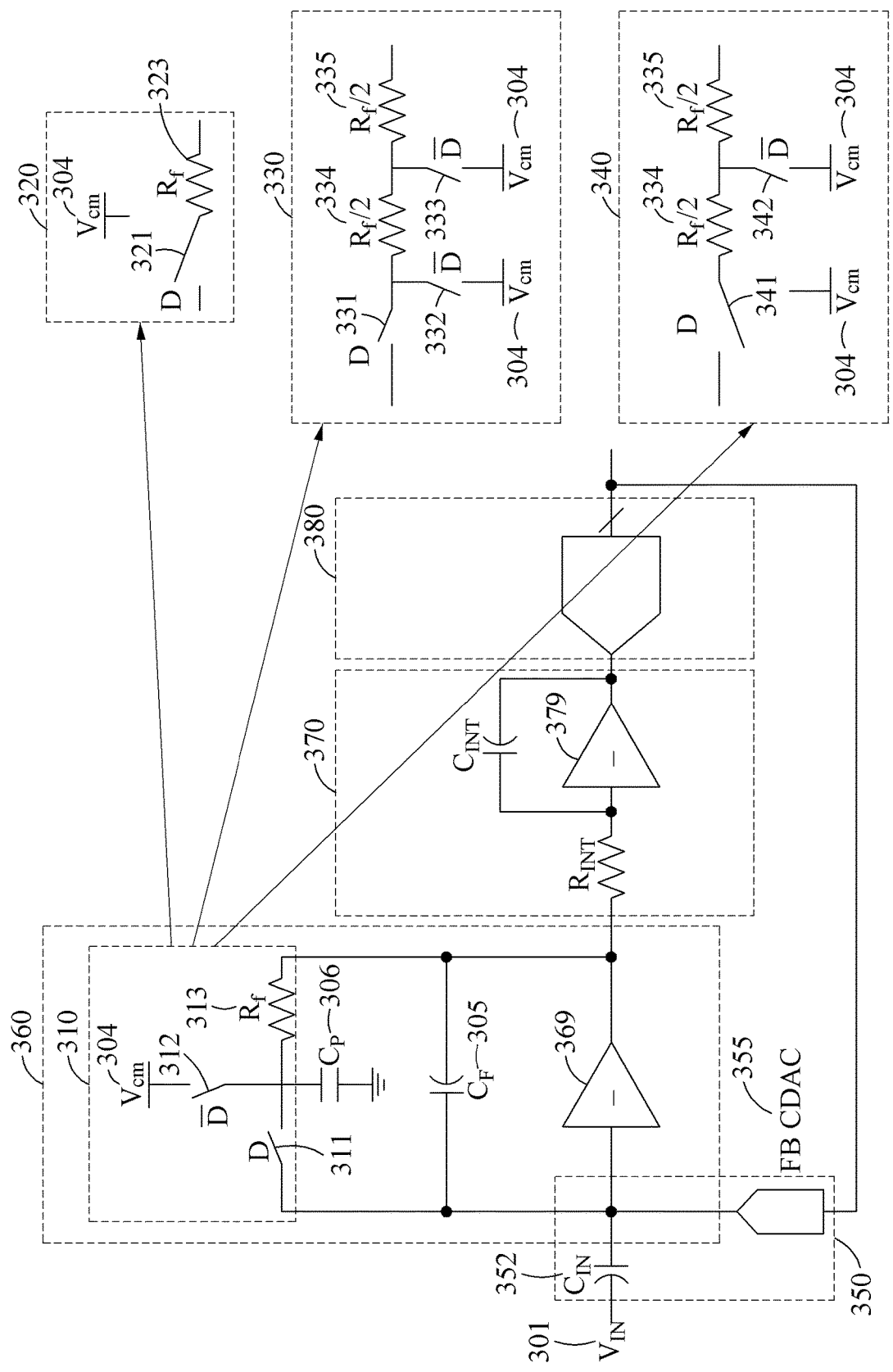
FIG. 3 illustrates an example of a structure of a modulation apparatus with a duty-cycled resistor.

FIG. 3 illustrates an example of a structure of a modulation apparatus with a duty-cycled resistor.

A duty-cycled resistor may also be applicable to the modulation apparatus. For example, the modulation apparatus may include a delta-sigma modulator. The modulation apparatus may include a subtraction circuit 350, an amplification circuit 360, an integration circuit 370, and a quantization circuit 380. An input voltage Vin 301 may be applied to the subtraction circuit 350. The amplification circuit 360 may be connected to the subtraction circuit 350. The integration circuit 370 may be connected to the amplification circuit 360. The quantization circuit 380 may be connected to the integration circuit 370 and may output an output signal through an output terminal.

The amplification circuit 360 may include an amplifier 369, a first capacitor $C_{IN}$ 352, a second capacitor $C_F$ 305, and a duty-cycled resistor 310. The amplifier 369 may include an inverting terminal, and a non-inverting terminal connected to a reset voltage node Vcm 304. An input voltage Vin 301 may be applied to the first capacitor $C_{IN}$ 352, and the first capacitor $C_{IN}$ 352 may be connected to the inverting terminal. The second capacitor $C_F$ 305 may be connected to the inverting terminal and an output terminal of the amplifier 369. The duty-cycled resistor 310 may be connected in parallel to the second capacitor $C_F$ 305.

The duty-cycled resistor 310 may include a first resistor Rf 313. A switch of the duty-cycled resistor 310 may be repeatedly opened and closed in a predetermined period. A single period may include a first time interval and a second time interval. The duty-cycled resistor 310 may connect the first resistor Rf 313 and the inverting terminal and may open the first resistor Rf 313 and the reset voltage node Vcm 304 during the first time interval. The duty-cycled resistor 310 may open the first resistor Rf 313 and the inverting terminal and may connect the first resistor Rf 313 and the reset voltage node Vcm 304 during the second time interval.

The subtraction circuit 350 may include the first capacitor $C_{IN}$ 352 and a feedback capacitive digital-to-analog converter (FB CDAC) 355. The FB CDAC 355 may connect an output terminal to the inverting terminal.

The integration circuit 370 may include an integration resistor $R_{INT}$ 371 and an integration capacitor $C_{INT}$ 372. The integration resistor $R_{INT}$ 371 may be connected to an output terminal of the amplification circuit 360, and the integration capacitor $C_{INT}$ 372 may form a feedback path between an output terminal and an inverting terminal of the integration circuit 370.

The duty-cycled resistor 310 may include a first resistor Rf 313. A switch of the duty-cycled resistor 310 may be repeatedly opened and closed in a predetermined period. A single period may include a first time interval and a second time interval. The duty-cycled resistor 310 may connect the first resistor Rf 313 and the inverting terminal and may open the first resistor Rf 313 and the reset voltage node Vcm 304 during the first time interval. The duty-cycled resistor 310 may open the first resistor Rf 313 and the inverting terminal and may connect the first resistor Rf 313 and the reset voltage node Vcm 304 during the second time interval.

In an example, the duty-cycled resistor 310 may include a first switch 311 and a second switch 312. The first switch 311 may connect the first resistor Rf 313 and the inverting terminal during the first time interval and may open the first resistor Rf 313 and the inverting terminal during the second time interval. The second switch 312 may open the first resistor Rf 313 and the reset voltage node Vcm 304 during the first time interval and may connect the first resistor Rf 313 and the reset voltage node Vcm 304 during the second time interval. The first resistor Rf 313 and the reset voltage node Vcm 304 may be shorted by the second switch 312 during the second time interval. Accordingly, electric charges stored in a parasitic capacitor Cp 306 may be removed.

In another example, a duty-cycled resistor 320 may be used instead of the duty-cycled resistor 310. The duty-cycled resistor 320 may include a third switch 321 and a first resistor Rf 323. The third switch 321 may connect the first resistor Rf 323 and the inverting terminal during the first time interval and may open the first resistor Rf 323 and the inverting terminal during the second time interval. The third switch 321 may open the first resistor Rf 323 and the reset voltage node Vcm 304 during the first time interval and may short the first resistor Rf 323 and the reset voltage node Vcm 304 during the second time interval. The first resistor Rf 323 and the reset voltage node Vcm 304 may be shorted by the third switch 321 during the second time interval. Accordingly, electric charges stored in the parasitic capacitor Cp 306 may be removed.

If a resistor is large, resetting may not be performed quickly enough with a single switch. In another example, the resistor may be divided into two or more smaller resistors; thus, resetting may be more quickly performed through a plurality of switches. A duty-cycled resistor 330 may be used instead of the duty-cycled resistor 310. In the duty-cycled resistor 330, the first resistor Rf 313 may include a second resistor 334 and a third resistor 335. The duty-cycled resistor 330 may include a fourth switch 331, a fifth switch 332, and a sixth switch 333. The second resistor 334 and the third resistor 335 may each be $R_f/2$, but are not limited thereto.

The fourth switch 331 may connect the second resistor 334 and the inverting terminal during the first time interval and may open the second resistor 334 and the inverting terminal during the second time interval. The fifth switch 332 may open the second resistor 334 and the reset voltage node Vcm 304 during the first time interval and may connect the second resistor 334 and the reset voltage node Vcm 304 during the second time interval. The sixth switch 333 may open the third resistor 335 and the reset voltage node Vcm 304 during the first time interval and may connect the third resistor 335 and the reset voltage node Vcm 304 during the second time interval. During the second time interval, the second resistor 334 and the reset voltage node Vcm 304 may be shorted by the fifth switch 332 and the third resistor 335, and the reset voltage node Vcm 304 may be shorted by the sixth switch 333. Accordingly, electric charges stored in the parasitic capacitor Cp 306 may be removed.

In another example, a duty-cycled resistor 340 may be used instead of the duty-cycled resistor 310. In the duty-cycled resistor 340, the first resistor Rf 313 may include a second resistor 334 and a third resistor 335. The duty-cycled resistor 340 may include a seventh switch 341 and an eighth switch 342. The seventh switch 341 may connect the second resistor 334 and the inverting terminal during the first time interval and may open the second resistor 334 and the inverting terminal during the second time interval. The seventh switch 341 may open the second resistor 334 and the reset voltage node Vcm 304 during the first time interval and may connect the second resistor 334 and the reset voltage node Vcm 304 during the second time interval. The eighth switch 342 may open the third resistor 335 and the reset voltage node Vcm 304 during the first time interval and may connect the third resistor 335 and the reset voltage node Vcm 304 during the second time interval. The second resistor 334 and the third resistor 335 may each be $R_f/2$, but are not limited thereto.

However, the duty-cycled resistors 330 and 340 are merely examples, and a resistor may be divided into three or more segments.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplification apparatus comprising:
   an amplifier having an inverting terminal, and a non-inverting terminal connected to a reset voltage node;
   a first capacitor connected to the inverting terminal, an input voltage being applied to the first capacitor;
   a second capacitor connected to the inverting terminal and an output terminal of the amplifier; and
   a duty-cycled resistor, connected in parallel to the second capacitor, comprising a first resistor, the duty-cycled resistor being configured to
   connect the first resistor and the inverting terminal and to disconnect the first resistor and the reset voltage node during a first time interval included in a period to complete an on-and-off cycle of the duty-cycled resistor, and
   disconnect the first resistor and the inverting terminal and to connect the first resistor and the reset voltage node during a second time interval included in the period.

2. The amplification apparatus of claim 1, wherein
the duty-cycled resistor comprises a first switch and a second switch,
the first switch is configured to perform the connecting of the first resistor and the inverting terminal during the first time interval and to perform the disconnecting of the first resistor and the inverting terminal during the second time interval, and
the second switch is configured to perform the disconnecting of the first resistor and the reset voltage node during the first time interval and to perform the connecting of the first resistor and the reset voltage node during the second time interval.

3. The amplification apparatus of claim 1, wherein
the duty-cycled resistor comprises a third switch, and the third switch is configured to:
perform the connecting of the first resistor and the inverting terminal during the first time interval;
performing the disconnecting of the first resistor and the inverting terminal during the second time interval;
perform the disconnecting of the first resistor and the reset voltage node during the first time interval; and
perform the connecting of the first resistor and the reset voltage node during the second time interval.

4. The amplification apparatus of claim 1, wherein
the first resistor comprises a second resistor and a third resistor,
the duty-cycled resistor comprises a fourth switch, a fifth switch, and a sixth switch,
the fourth switch is configured to connect the second resistor and the inverting terminal during the first time interval and to disconnect the second resistor and the inverting terminal during the second time interval,
the fifth switch is configured to disconnect the second resistor and the reset voltage node during the first time interval and to connect the second resistor and the reset voltage node during the second time interval, and
the sixth switch is configured to disconnect the third resistor and the reset voltage node during the first time interval and to connect the third resistor and the reset voltage node during the second time interval.

5. The amplification apparatus of claim 1, wherein
the first resistor comprises a second resistor and a third resistor,
the duty-cycled resistor comprises a seventh switch and an eighth switch,
the seventh switch is configured to:
connect the second resistor and the inverting terminal during the first time interval;
disconnect the second resistor and the inverting terminal during the second time interval;
disconnect the second resistor and the reset voltage node during the first time interval; and
connect the second resistor and the reset voltage node during the second time interval, and
the eighth switch is configured to:
disconnect the third resistor and the reset voltage node during the first time interval; and
connect the third resistor and the reset voltage node during the second time interval.

6. An integration apparatus comprising:
an amplifier having an inverting terminal, and a non-inverting terminal connected to a reset voltage node;
a duty-cycled resistor connected to the inverting terminal, an input voltage being applied to the duty-cycled resistor; and
a first capacitor connected to the inverting terminal and an output terminal of the amplifier,
wherein the duty-cycled resistor comprises a first resistor and a second resistor,
wherein the duty-cycled resistor is configured to:
connect the first resistor and the inverting terminal and to disconnect the first resistor and the reset voltage node during a first time interval included in a period to complete an on-and-off cycle of the duty-cycled resistor, and
disconnect the second resistor and the inverting terminal and to connect the second resistor and the reset voltage node during a second time interval included in the period.

7. The integration apparatus of claim 6, wherein
the duty-cycled resistor comprises a first switch and a second switch,
the first switch is configured to perform the connecting of the first resistor and the inverting terminal during the first time interval and to perform the disconnecting of the first resistor and the inverting terminal during the second time interval, and
the second switch is configured to perform the disconnecting of the second resistor and the reset voltage node during the first time interval and to perform the connecting of the second resistor and the reset voltage node during the second time interval.

8. The integration apparatus of claim 6, wherein
the duty-cycled resistor comprises a third switch, and
the third switch is configured to:
perform the connecting of the first resistor and the inverting terminal during the first time interval;
perform the disconnecting of the first resistor and the inverting terminal during the second time interval;
perform the disconnecting of the second resistor and the reset voltage node during the first time interval; and
perform the connecting of the second resistor and the reset voltage node during the second time interval.

9. The integration apparatus of claim 6, wherein
the duty-cycled resistor comprises a fourth switch, a fifth switch, and a sixth switch,
the fourth switch is configured to perform the connecting of the first resistor and the inverting terminal during the first time interval and to perform the disconnecting of the first resistor and the inverting terminal during the second time interval,
the fifth switch is configured to perform disconnecting of the first resistor and the reset voltage node during the first time interval and to perform connecting of the first resistor and the reset voltage node during the second time interval, and
the sixth switch is configured to perform disconnecting of the second resistor and the reset voltage node during the first time interval and to perform connecting of the second resistor and the reset voltage node during the second time interval.

10. The integration apparatus of claim 6, wherein
the duty-cycled resistor comprises a seventh switch and an eighth switch, the seventh switch is configured to:
perform the connecting of the first resistor and the inverting terminal during the first time interval;
perform the disconnecting of the first resistor and the inverting terminal during the second time interval;
perform the disconnecting of the first resistor and the reset voltage node during the first time interval; and
perform the connecting of the first resistor and the reset voltage node during the second time interval, and the eighth switch is configured to:
perform the disconnecting of the second resistor and the reset voltage node during the first time interval; and
perform the connecting of the second resistor and the reset voltage node during the second time interval.

11. A modulation apparatus comprising:
a subtraction circuit to which an input voltage is applied;
an amplification circuit, connected to the subtraction circuit, comprising:
an amplifier having an inverting terminal and a non-inverting terminal, the non-inverting terminal connected to a reset voltage node;
a first capacitor connected to the inverting terminal, the input voltage being applied to the first capacitor;
a second capacitor connected to the inverting terminal and an output terminal of the amplifier; and
a duty-cycled resistor, connected in parallel to the second capacitor, comprising a first resistor;
an integration circuit connected to the amplification circuit; and
a quantization circuit connected to the integration circuit and configured to output an output signal through an output terminal,
wherein the duty-cycled resistor is configured to connect the first resistor and the inverting terminal and to disconnect the first resistor and the reset voltage node during a first time interval included in a period to complete an on-and-off cycle of the duty-cycled resistor, and to disconnect the first resistor and the inverting terminal and to connect the first resistor and the reset voltage node during a second time interval included in the period, and
wherein the subtraction circuit comprises the first capacitor, and a feedback capacitive digital-to-analog converter (FB CDAC) configured to connect the output terminal to the inverting terminal.

12. The modulation apparatus of claim 11, wherein
the duty-cycled resistor comprises a first switch and a second switch,
the first switch is configured to perform the connecting of the first resistor and the inverting terminal during the first time interval and to perform the disconnecting of the first resistor and the inverting terminal during the second time interval, and
the second switch is configured to perform the disconnecting of the first resistor and the reset voltage node during the first time interval and to perform the connecting of the first resistor and the reset voltage node during the second time interval.

13. The modulation apparatus of claim 11, wherein
the duty-cycled resistor comprises a third switch, and
the third switch is configured to:
perform the connecting of the first resistor and the inverting terminal during the first time interval;
perform the disconnecting of the first resistor and the inverting terminal during the second time interval;
perform the disconnecting of the first resistor and the reset voltage node during the first time interval; and
perform the connecting of the first resistor and the reset voltage node during the second time interval.

14. The modulation apparatus of claim 11, wherein
the first resistor comprises a second resistor and a third resistor,
the duty-cycled resistor comprises a fourth switch, a fifth switch, and a sixth switch,
the fourth switch is configured to connect the second resistor and the inverting terminal during the first time interval and to disconnect the second resistor and the inverting terminal during the second time interval,
the fifth switch is configured to disconnect the second resistor and the reset voltage node during the first time interval and to connect the second resistor and the reset voltage node during the second time interval, and
the sixth switch is configured to disconnect the third resistor and the reset voltage node during the first time interval and to connect the third resistor and the reset voltage node during the second time interval.

15. The modulation apparatus of claim 11, wherein
the first resistor comprises a second resistor and a third resistor,
the duty-cycled resistor comprises a seventh switch and an eighth switch,
the seventh switch is configured to:
connect the second resistor and the inverting terminal during the first time interval;
disconnect the second resistor and the inverting terminal during the second time interval;
disconnect the second resistor and the reset voltage node during the first time interval; and
connect the second resistor and the reset voltage node during the second time interval, and
the eighth switch is configured to:
disconnect the third resistor and the reset voltage node during the first time interval; and
connect the third resistor and the reset voltage node during the second time interval.

* * * * *